United States Patent
Downey et al.

(10) Patent No.: US 6,576,563 B2
(45) Date of Patent: Jun. 10, 2003

(54) METHOD OF MANUFACTURING A SEMICONDUCTOR DEVICE EMPLOYING A FLUORINE-BASED ETCH SUBSTANTIALLY FREE OF HYDROGEN

(75) Inventors: Stephen W. Downey, Orlando, FL (US); Edward B. Harris, Orlando, FL (US); Paul B. Murphey, Winter Garden, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/047,516

(22) Filed: Oct. 26, 2001

(65) Prior Publication Data

US 2003/0092273 A1 May 15, 2003

(51) Int. Cl.[7] .......................................... H01L 21/4763
(52) U.S. Cl. ...................... 438/725; 438/618; 438/648; 438/649; 438/656; 438/689; 438/694; 438/695; 438/720; 438/734; 438/745; 438/754; 438/785; 156/643; 156/656; 156/657
(58) Field of Search ................................ 438/618, 648, 438/649, 656, 689, 694, 695, 720, 734, 745, 754, 785, 725; 156/643, 656, 657

(56) References Cited

U.S. PATENT DOCUMENTS 4,877,482 A * 10/1989 Knapp et al. ................. 216/67
5,420,071 A * 5/1995 Burke ......................... 438/720

OTHER PUBLICATIONS

Graff et al. ("Wafer Cleaning/Stripping rf and microwave plasma for resist and post–etch polymer removal", Solid State Technology, Dec. 2001, pp. 37–38, 40, 42).*

* cited by examiner

Primary Examiner—Kamand Cuneo
Assistant Examiner—Lisa Kilday

(57) ABSTRACT

The present invention provides a method of manufacturing a semiconductor device. In one embodiment, the method includes forming a positive relief structure from a material located on a substrate, the step of forming the positive relief structure leaving an unwanted remnant of said material proximate a base of the positive relief structure. The method further includes cleaning the positive relief structure. In addition, the method includes removing the unwanted remnant with a gas containing fluorine and that is substantially free of hydrogen.

20 Claims, 4 Drawing Sheets

METHOD OF MANUFACTURING A SEMICONDUCTOR DEVICE EMPLOYING A FLUORINE-BASED ETCH SUBSTANTIALLY FREE OF HYDROGEN

TECHNICAL FIELD OF THE INVENTION

The present invention is directed, in general, to semiconductor devices and, more specifically, to a method of manufacturing a semiconductor device employing a fluorine-based etch substantially free of hydrogen.

BACKGROUND OF THE INVENTION

The semiconductor manufacturing industry is continually striving to manufacture smaller, faster and more reliable semiconductor devices. To this end, both active and passive devices are continually improved to enhance overall integrated circuit (IC) performance. As is well known, various active devices and other structures are commonly formed within an IC. These various active devices and structures are what allow fast, reliable and inexpensive ICs to be manufactured for today's ever competitive computer and telecommunications markets.

The fabrication of semiconductor devices, such as contacts and capacitors, typically involves numerous distinct steps. Among the final steps is a metallization stage where metal patterns in such contacts are photolithographically defined. Once defined, these patterns are etched to disassociate the contacts (or other device being manufactured) from other areas or devices during a post-metal etch process.

In conventional processes, the post-metal etch consists of a series of repeated steps employed to remove photoresist present around the contacts or other devices, as well as to purge harmful chemicals, such as chlorine ($Cl_2$), from the layers. It is well known that traces of chlorine left behind may result in a catalytic reaction with water present in the process and may result in the creation of aluminum hydroxide (AlOH) in those devices formed with aluminum. Oxygen ($O_2$) or fluorine ($F_2$) is commonly used to purge the chlorine from the sidewalls of devices in alternating steps of strip and passivation-strip-passivation during the post-metal etch process.

Unfortunately, conventional etch techniques often leave conductive material that provide electrical connections between portions of the contact or device and other portions of an integrated circuit (IC). In those layers forming the contact or device, typically a metal layer of titanium nitride (TiN) not etched completely through, remaining electrical connections often result in short-circuits across such under-etched portions. These short-circuits are typically found in the lower layers of contacts or devices where defects in upper layers have blocked the etch of the lower layers. Those layers having short-circuits, often referred to "stringers," after the post-metal etch often result in undesirable current across portions of the device, which substantially reduces product yields. This result is, of course high undesirable in view of the economics of IC fabrication that demand maximum device yields, especially at the "back-end" (or latter stages) of the manufacturing process where the device wafers are most valuable.

Accordingly, what is needed in the art is an improved method of manufacturing semiconductor devices, as well as integrated circuits, that does not suffer from such deficiencies found in the prior art.

SUMMARY OF THE INVENTION

To address the above-discussed deficiencies of the prior art, the present invention provides a method of manufacturing a semiconductor device. In one embodiment, the method includes forming a positive relief structure from a material located on a substrate, the step of forming the positive relief structure leaving an unwanted remnant of said material proximate a base of the positive relief structure. The method further includes cleaning the positive relief structure. In addition, the method includes removing the unwanted remnant with a gas containing fluorine and that is substantially free of hydrogen. In another aspect, the present invention provides a method of manufacturing an integrated circuit using this method.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion.

DETAILED DESCRIPTION

Figure 1:
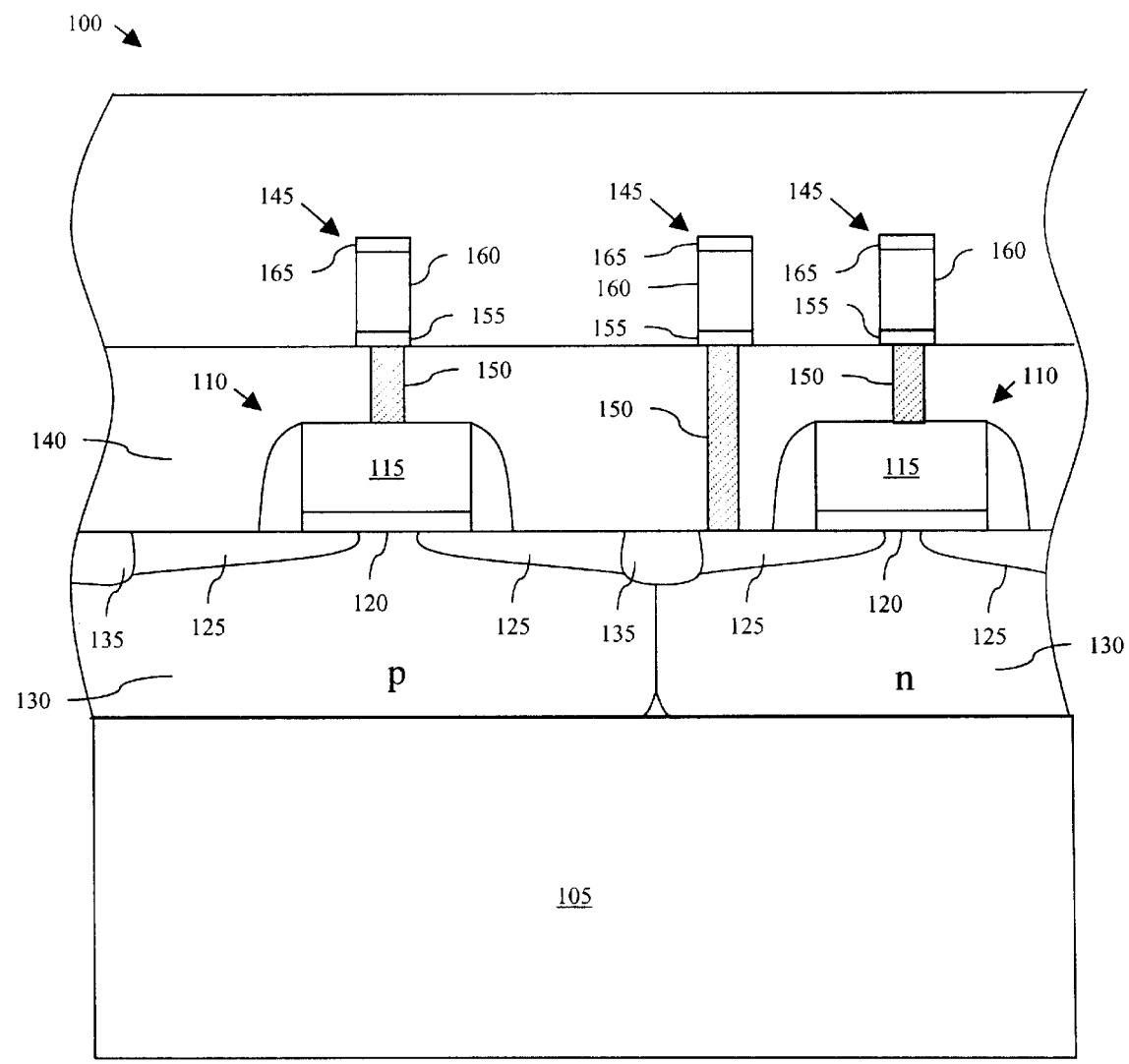
FIG. 1 illustrates a partial view of an exemplary embodiment of a semiconductor device that may be manufactured on a semiconductor wafer using methods covered by the present invention.

Referring initially to FIG. 1, illustrated is a partial view of an exemplary embodiment of a semiconductor device 100, such as an integrated circuit, that may be manufactured on a semiconductor wafer 105 using methods covered by the present invention. This particular embodiment includes several different semiconductor structures, such as transistors 110 that have gates 115, gate oxides 120 and source/drains 125 formed in tubs 130 that may be appropriately doped as design requires. The source/drains 125 are isolated by isolation structures 135, such as shallow trench isolation structures. An interlevel dielectric layer 140 is located over the transistors 110 that are connected to metal interconnects 145, whose fabrication is explained in more detail below, by contact plugs 150. The metal interconnects 145 are located on the interlevel dielectric layer 140 and may typically include a first metal layer 155, such as a stacked layer of titanium/titanium nitride.

A second metal layer 160 of another conductive metal, such as aluminum, aluminum alloys, copper and combinations thereof, is located over the first metal layer 155. The metal interconnects 145 may have a third metal layer 165 deposited on the second metal layer 160. While the disclosure herein focuses on the formation of metal interconnect semiconductor structures using the principles of the present invention, it should be understood that the different embodiments of the methods discussed herein and covered by the present invention may be used to manufacture other semiconductor structures, such as metal-oxide-metal (MOM) capacitors and other semiconductor structures in which it is desirable to remove stringers from between those structures.

Figure 2:
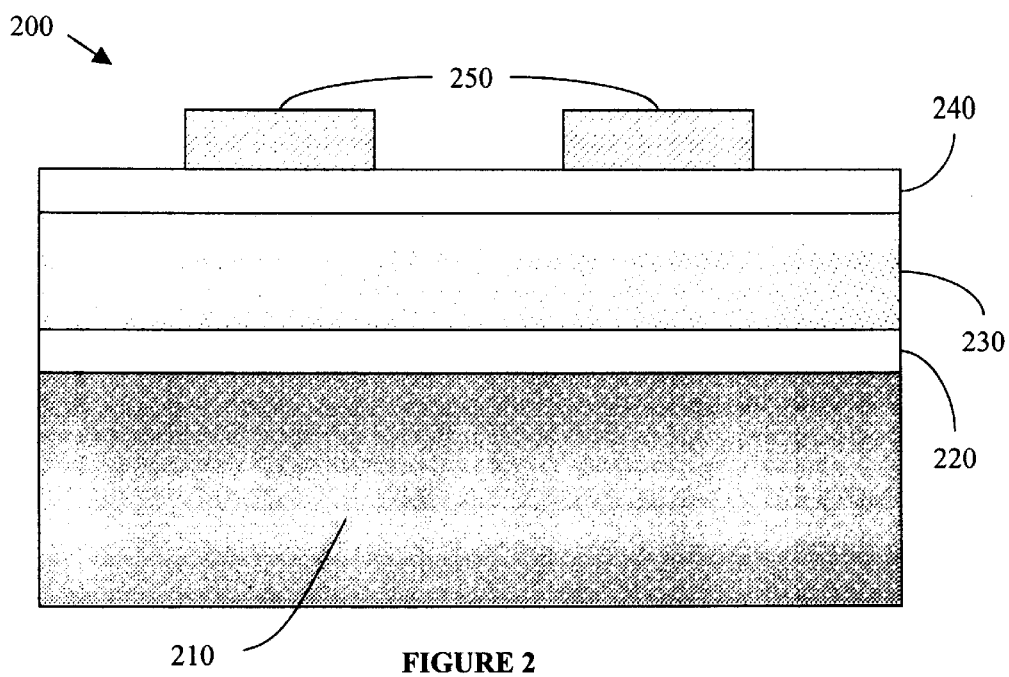
FIG. 2 illustrates a partially completed semiconductor device at an initial stage of production.

Referring now to FIG. 2, illustrated is a magnified view of an exemplary embodiment of a partially completed semiconductor structure 200, which may be the metal interconnects 145 mentioned above, during an initial stage of manufacture. As illustrated, the semiconductor structure 200 may be located over a substrate 210, such as an interlevel dielectric layer. For simplicity, it should be noted that the previously discussed contact plugs are not shown in this magnified view. It should be further noted that the present invention may be conducted at any level of a semiconductor device, including the wafer level, and thus, is not limited to any particular level.

Over the substrate 210, a first metal layer 220 is formed using conventional deposition techniques, such as chemical vapor deposition (CVD) or physical vapor deposition (PVD). In an exemplary embodiment, the material comprising the first metal layer 220 may be titanium (Ti), titanium nitride (TiN), or other suitable conductive materials. A second metal layer 230 may then be formed over the first metal layer 220. In one embodiment, the second metal layer 230 may be formed from aluminum (Al), however the present invention is not so limited. A third metal layer 240 may then be formed over the second metal layer 230 and may be comprised of Ti, TiN or another suitable material, similar to the first metal layer 220 described above.

A conventional mask 250, such as a photolithographic mask, is deposited over the third metal layer 240, and may be conventionally patterned as desired to shape the structure of the semiconductor structure 200. In the illustrated embodiment, the metal layers 220, 230, 240 are shown blanket deposited over the substrate 210. Of course, other techniques for forming or depositing such materials may also be employed. Although the semiconductor structure 200 is illustrated having only three metal layers 220, 230, 240, those skilled in the art understand that a semiconductor structure manufactured according to the principles described herein may include more or less material layers without departing from the scope of the present invention. In addition, in alternative embodiments, the layers 220, 230, 240 need not all be metal, and as previously mentioned, the materials may be selected to form a metal-oxide-metal capacitor, if so desired.

Figure 3:
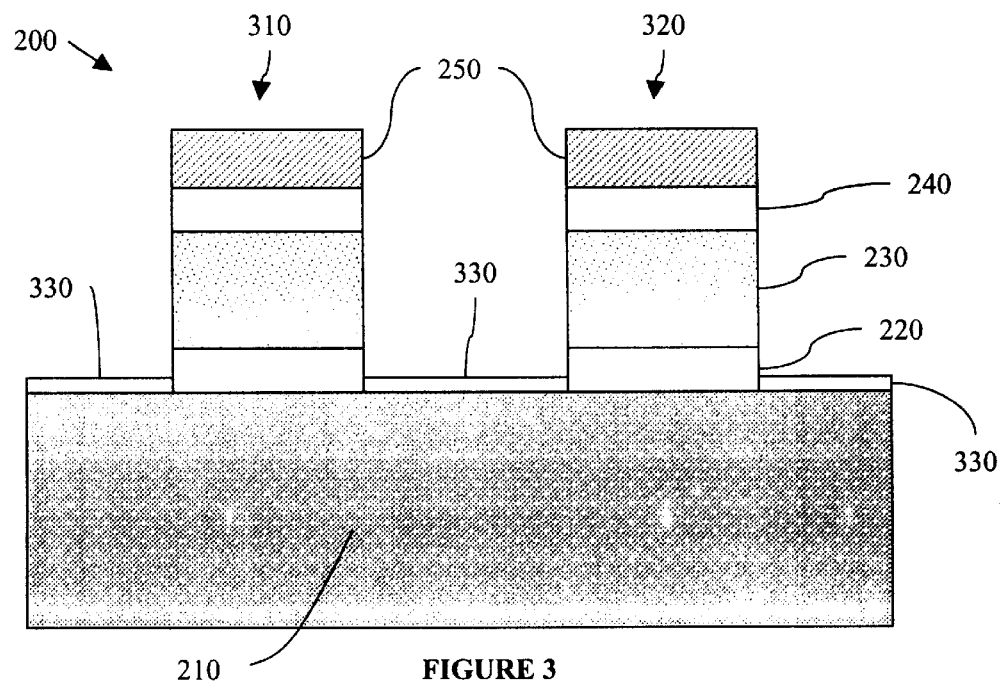
FIG. 3 illustrates the semiconductor device of FIG. 1 during a latter stage wherein a remnant of material remains after an initial etch step.

Turning now to FIG. 3, illustrated is the initial semiconductor structure 200 of FIG. 2 during a latter stage of manufacture. As illustrated, portions of the metal layers 220, 230, 240 have been removed by conventional etching or other removal techniques, thereby, leaving, in this particular embodiment, first and second semiconductor interconnect structures 310, 320, which were protected by the mask 250.

Unfortunately, as is often the case, an unwanted remnant 330 of the first metal layer 220 is not removed during the main removal process. As used herein, the term "unwanted remnant" includes those small material filaments remaining between semiconductor structures after those structures have been formed and cleaned, such as after undergoing an etching process followed by a passivation/strip process. Those skilled in the art understand the problems that may occur, such as current leakage and short-circuiting, when such remnants 330 are left behind during structure formation. In an attempt to rid the first and second interconnects 310, 320 of such remnants 330, a post-metal etch passivation/strip process in the present invention is employed. Such a process is discussed below with respect to FIG. 4, as well as with reference to a process flow diagram 500 illustrated in FIG. 5.

Figure 4:
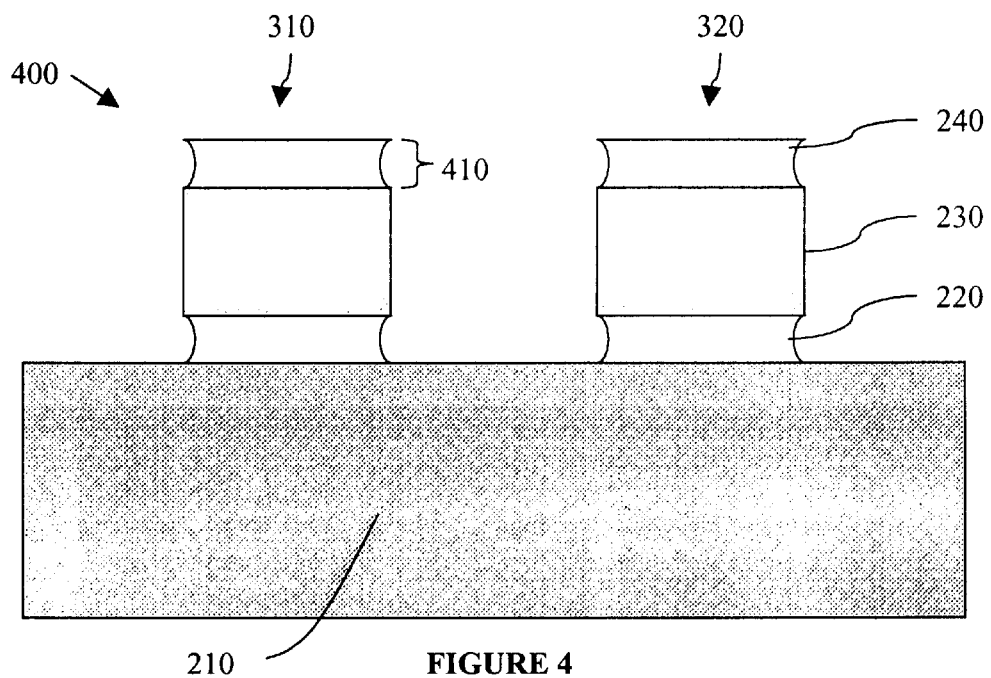
FIG. 4 illustrates a completed semiconductor device following a fluorine etch that is substantially free of hydrogen.
Figure 5:
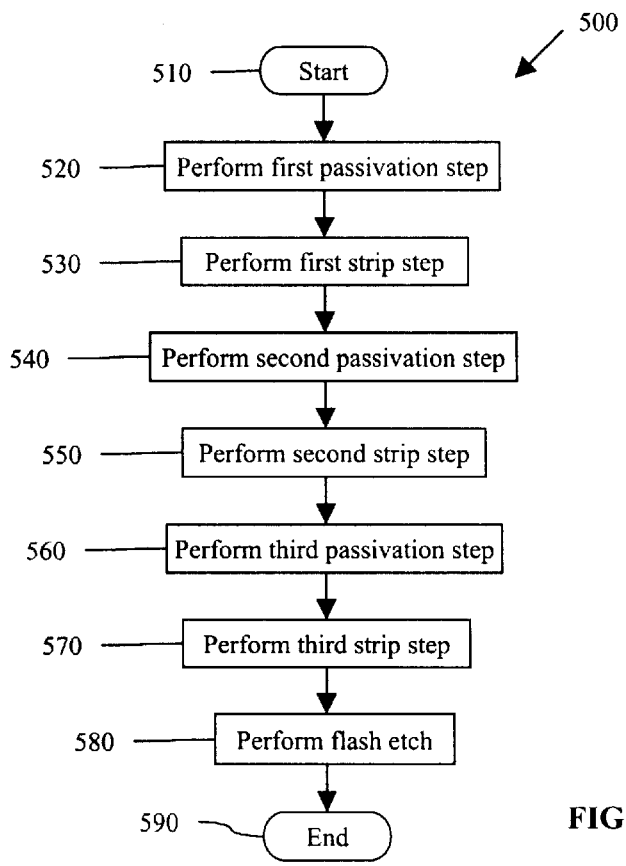
FIG. 5 illustrates a flow diagram of one embodiment of a method of manufacturing the semiconductor device of FIG. 3.

Looking now concurrently at FIGS. 4 and 5, illustrated in FIG. 4 is a completed semiconductor structure 400 constructed in accordance with the principles of the present invention. FIG. 5 illustrates a flow diagram 500 of one embodiment of a method of manufacturing the semiconductor structure 400 of FIG. 4. As shown in FIG. 4, the remnants 330 left in FIG. 3 are removed in accordance with the method of the present invention. Specifically, a quick flash etch using a gas containing fluorine and being substantially free of hydrogen is employed to remove the remnants 330. As used herein, the phrase "substantially free of hydrogen" means a gas wherein the concentration of any hydrogen therein is so low, e.g., trace amounts of hydrogen, as to not affect the reactivity of the fluorine with respect to a material with which the fluorine reacts.

In an advantageous embodiment, the gas contains a carbon fluorinated gas, such as $CF_4$. In alternative embodiments, the gas may be a multi-carbon fluorinated gas, such as $C_2F_6$, $C_4F_8$, $C_2F_8$ or $C_5F8$. However, in other embodiments, the gas may be $NF_3$, or $SF_6$. Of course, other elements, which do not substantially affect the reactivity of the fluorine, may also be included in the gas mixture.

Preferentially, the flash etch of the present invention is employed as a step within a conventional passivation/strip process used to clean device structures formed on semiconductor wafers. In such an embodiment, as illustrated in FIG. 5, the passivation/strip process includes alternating between a strip process and a passivation process. After a Start step 510, the semiconductor structure 400 is first subjected to a passivation process that includes subjecting the structure to $H_2O$ for about 15 seconds at a step 520. Then, at a step 530, the semiconductor structure 400 is subjected to a strip process that includes subjecting it to a gas mixture of $H_2O$, $O_2$, and $N_2$ for about another 15 seconds. In an advantageous embodiment, both the passivation and strip steps are conducted at a power of about 1400 watts, a temperature of about 250° C. and a pressure of about 2 Torr. In alternative embodiments, both steps may be conducted at any temperature above 100° C., provided the etch rate for the TiN is relatively fast. At a step 540, another passivation step is performed on the semiconductor structure 400, while at a step 550 another strip step is performed. At a step 560 and step 570, fifth and sixth steps in the passivation/strip process include the performance of yet another passivation step and another strip step, respectively. Those skilled in the art understand the steps involved in using a typical passivation/strip process to clean device structures on a semiconductor wafer, as well as the advantages and disadvantages associated with such processes.

At a step 580, the flash etch step, as generally discussed above is performed as a seventh step. Of course, the flash etch step need not necessarily be performed at the end of the cleaning process, however the results achieved by performing the flash etch near an end of the cleaning process may be more desirable. The process then ends at an end step 590. Table 1 illustrates in greater detail the passivation/strip cleaning process incorporating a flash etch step according to the present invention discussed with respect to FIGS. 4 and 5. Although seven steps are discussed with respect to the cleaning process incorporating the principles of the present invention, those skilled in the art understand that greater or fewer steps may be employed, while remaining within the scope of the present invention. Table I below sets forth one embodiment of such a process as generally illustrated in FIG. 5.

TABLE I

| STEP | 1 | 2 | 3 | 4 | 5 | 6 | 7 |
|---|---|---|---|---|---|---|---|
| | Pass | Strip | Pass | Strip | Pass | Strip | Flash Etch |
| $H_2O$ (sccm) | 500 | 200 | 500 | 200 | 500 | 200 | 0 |
| $O_2$ (sccm) | 0 | 3500 | 0 | 3500 | 0 | 3500 | 3500 |
| $CF_4$ (sccm) | 0 | 0 | 0 | 0 | 0 | 0 | 80 |
| $N_2$ (sccm) | 0 | 200 | 0 | 200 | 0 | 200 | 0 |
| Time (sec) | 15 | 15 | 15 | 15 | 15 | 15 | 5 |

In the embodiment illustrated with reference to TABLE 1, the gas used for the flash etch includes both fluorine and oxygen. In such an embodiment, the remnants 330 are removed by flowing the oxygen at a rate of about 3500 sccm and flowing $CF_4$ at a rate of about 80 sccm for a period of time of about 5 seconds. In related embodiments, the period of time the flash etch is performed may extend as long as about 10 seconds. However, in an exemplary embodiment where the unwanted remnants 330 are comprised of titanium, since fluorine easily etches titanium, the time for the flash etch does not have to exceed 10 seconds. Of course, other flow rates of the various elements present in a gas according to the present invention may be employed without departing from the principles of the present invention.

As illustrated in FIG. 4, in an exemplary embodiment, a flash etch in accordance with the present invention results in a non-isotropic etch of the material comprising the first and third metal layers 220, 240 of the semiconductor structure 400 since these layers 220, 240 are typically comprised of the same material as the remnants 330. As a result, "isotropic attack" may result in depressions (one of which is designated 410) on the sides of the layers 220, 240 most susceptible to the reactivity of the gas mixture used in the flash etch. The possibility of such isotropic attack on these layers 220, 240 helps demonstrate why a flash etch according to the principles described herein should not be performed for excessive periods of time.

By providing a fluorine-based flash etch, substantially free of hydrogen, for quick removal of unwanted remnants between semiconductor structures, the present invention provides several benefits over the prior art. For instance, since such remnants often form tiny stringers within a device, the present invention provides for quick and easy removal of even those stringers, even those that are essentially invisible. Those skilled in the art understand that removing such stringers allows for a higher device yields at the end of the manufacturing process by reducing the number of short-circuits and current leakages throughout the devices constructed. Moreover, the flash etch of the present invention is employable in almost any environment by providing a gas having a reactive element intended to etch a particular material comprising an unwanted remnant, but being substantially free of those elements that tend to negate the reactivity of the reactive element. As a result, the broad scope of the present invention extends far beyond etching gases merely having fluorine and being substantially free of hydrogen, while retaining benefits such as those described above.

Figure 6:
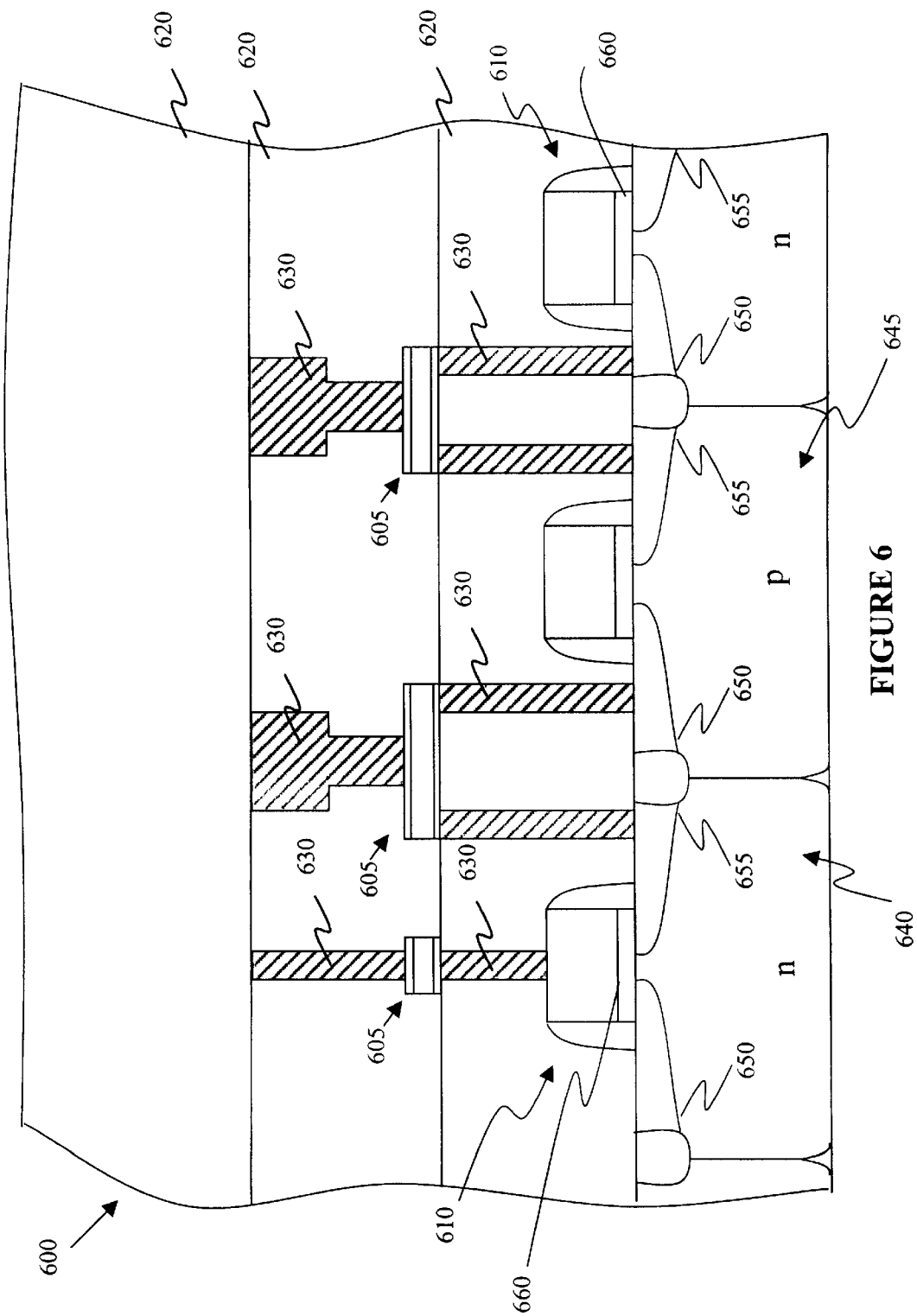
FIG. 6 illustrates a sectional view of a conventional integrated circuit (IC) incorporating interconnects formed in accordance with the present invention.

Turning finally to FIG. 6, illustrated is a sectional view of a conventional integrated circuit (IC) 600 incorporating interconnects 605 formed in accordance with the present invention. The IC 600 may include conventional active devices, such as transistors, used to form CMOS devices, BiCMOS devices, Bipolar devices, or other types of active devices. The IC 600 may further include passive devices such as inductors or resistors, or it may also include other active devices, such as optical devices or optoelectronic devices. Those skilled in the art are familiar with these various types of device and their manufacture.

In the embodiment illustrated in FIG. 6, components of the conventional IC 600 include transistors 610, having gate oxide layers 660, formed on a semiconductor wafer. The transistors 610 may be metal-oxide semiconductor field effect transistors 610 (MOSFETs), however other types of transistors are within the scope of the present invention. Interlevel dielectric layers 620 are shown deposited over the transistors 610.

The interconnects 605 manufactured according to the present invention are formed on the interlevel dielectric layers 620, in accordance with the principles described above. Interconnect plugs 630 are also conventionally formed in the interlevel dielectric layers 620 to complete the interconnections between the various components therein and the interconnects 605 to form an operative integrated circuit. Those skilled in the art understand how to connect these various devices together to form an operative integrated circuit. Also illustrated are conventionally formed tubs 640, 645, source regions 650, and drain regions 655.

Of course, use of the methods of the present invention is not limited to the manufacture of the particular IC 600 illustrated in FIG. 6. In fact, the present invention is broad enough to encompass the manufacture of many types of integrated circuits formed on a semiconductor wafer that would benefit from the method of manufacturing a semiconductor device described herein. In addition, the present invention also encompasses integrated circuits having greater or fewer components than illustrated in the IC 600 of FIG. 6. Beneficially, each time the method of the present invention is employed to form part or all of a semiconductor device or structure in the IC 600, chip yields may be increased due to the reduction or elimination of stringers among the semiconductor structures illustrated therein.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:

forming a positive relief structure from a material located on a substrate, said forming leaving an unwanted remnant of said material proximate a base of said positive relief structure;

cleaning said positive relief structure, said cleaning including:

stripping said positive relief structure by subjecting said positive relief structure to a gas mixture of $H_2O$, $O_2$, and $N_2$; and passivating said positive relief structure by subjecting said positive relief structure to $H_2O$; and removing said unwanted remnant with a gas containing fluorine and being substantially free of hydrogen.

2. The method as recited in claim 1 wherein said gas further includes $O_2$.

3. The method as recited in claim 2 wherein removing includes flowing said $O_2$ at a rate of about 3500 sccm at a power of about 1400 watts and at a temperature of about 250° C. and a pressure of about 2 Torr.

4. The method as recited in claim 1 wherein said gas further includes carbon, nitrogen or sulfur.

5. The method as recited in claim 4 wherein said gas includes $CF_4$, $NF_3$, $C_2F_8$, $C_5F_8$, $C_2F_6$, $C_4F_8$ or $SF_6$.

6. The method as recited in claim 1 wherein removing includes subjecting said positive relief structure to a flow of said gas for a period of time ranging from about 5 seconds to about 10 seconds.

7. The method as recited in claim 6 wherein said subjecting is conducted at a power of about 1400 watts at a temperature of about 250° C. and a pressure of about 2 Torr.

8. The method as recited in claim 1 wherein forming said positive relief structure includes forming said positive relief structure to include titanium or titanium nitride.

9. The method as recited in claim 1 wherein said subjecting said positive relief structure to said gas mixture occurs for about 15 seconds and said stripping and said passivating are conducted at a power of about 1400 watts, a temperature of about 250° C. and a pressure of about 2 Torr.

10. The method as recited in claim 1 wherein removing includes flowing said gas at a rate of about 80 sccm at a power of about 1400 watts and at a temperature of about 250° C. and a pressure of about 2 Torr.

11. The method as recited in claim 1 wherein forming said positive relief structure includes forming an interconnect structure or a metal oxide metal capacitor.

12. A method of manufacturing an integrated circuit, comprising:

forming a positive relief structure comprising a conductive material located on a substrate, said forming leaving an unwanted remnant of said conductive material proximate a base of said positive relief structure;

cleaning said positive relief structure, said cleaning including:

stripping said positive relief structure by subjecting said positive relief structure to a gas mixture of $H_2O$, $O_2$, and $N_2$; and passivating said positive relief structure by subjecting said positive relief structure to $H_2O$; and removing said unwanted remnant with a gas containing fluorine and oxygen and being substantially free of hydrogen.

13. The method as recited in claim 12 wherein removing includes flowing said oxygen at a rate of about 3500 sccm and flowing said fluorine at a rate of about 80 sccm, at a power of about 1400 watts and at a temperature of about 250° C. and a pressure of about 2 Torr.

14. The method as recited in claim 12 wherein said gas includes carbon, nitrogen or sulfur.

15. The method as recited in claim 14 wherein said gas includes $CF_4$, $NF_3$, $C_2F_8$, $C_5F_8$, $C_2F_6$, $C_4F_8$ or $SF_6$.

16. The method as recited in claim 12 wherein removing includes subjecting said positive relief structure to a flow of said gas for a period of time ranging from about 5 seconds to about 10 seconds.

17. The method as recited in claim 16 wherein said subjecting is conducted at a power of about 1400 watts at a temperature of about 250° C. and a pressure of about 2 Torr.

18. The method as recited in claim 12 wherein forming said positive relief structure includes forming an interconnect structure or a metal oxide metal capacitor.

19. The method as recited in claim 12 wherein said subjecting said positive relief structure to said gas mixture occurs for about 15 seconds and said stripping and said passivating are conducted at a power of about 1400 watts, a temperature of about 250° C. and a pressure of about 2 Torr.

20. The method as recited in claim 12 further including forming transistors proximate said positive relief structure.

* * * * *